(12) United States Patent
Zhao

(10) Patent No.: US 6,329,290 B1
(45) Date of Patent: Dec. 11, 2001

(54) METHOD FOR FABRICATION AND STRUCTURE FOR HIGH ASPECT RATIO VIAS

(75) Inventor: Bin Zhao, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/512,396

(22) Filed: Feb. 24, 2000

(51) Int. Cl.$^7$ .................................................. H01L 21/311
(52) U.S. Cl. ............................................. 438/700; 438/638
(58) Field of Search ..................................... 438/622, 624, 438/631, 633, 629, 637, 638, 639, 700, 672, 675, 723, 724, 725, 524, 242

(56) References Cited

U.S. PATENT DOCUMENTS

| | | | |
|---|---|---|---|
| 5,877,084 | * | 3/1999 | Joshi et al. .............................. 438/46 |
| 6,054,384 | * | 4/2000 | Wang et al. ........................... 438/700 |
| 6,100,184 | * | 8/2000 | Zhao et al. ............................ 438/638 |
| 6,184,128 | * | 2/2001 | Wang et al. ........................... 438/637 |
| 6,211,092 | * | 4/2001 | Tang et al. ............................ 439/719 |

* cited by examiner

Primary Examiner—David Nelms
Assistant Examiner—David Nhu

(74) Attorney, Agent, or Firm—Farjami & Farjami LLP

(57) ABSTRACT

A via is first etched in a dielectric. Then a conformal layer is deposited over the dielectric and the via to reduce an initial width of the via to a target width. A trench is then etched in the dielectric and the conformal layer. Since the width of the via is reduced from the initial width to the target width, the resulting final via has a high aspect ratio. The via and the trench are then filled with metal which contacts an interconnect metal situated below the via. In one embodiment, copper is used to fill the via and the trench and also as the interconnect metal below the via. In one embodiment, the dielectric is silicon dioxide or fluorinated silicon dioxide and the conformal layer is silicon dioxide. In another embodiment, the dielectric is silicon dioxide or fluorinated silicon dioxide while the conformal layer is silicon nitride. To etch the trench in the dielectric and the conformal layer, a timed exposure to a carbon fluoride based plasma is employed. Alternatively, instead of timing the exposure to plasma, a suitable etch stop layer is used. In the embodiment where a conformal layer of high dielectric constant is used, the conformal layer remaining on the dielectric surface is removed using either chemical mechanical polishing or by plasma etching. The final structure is a via and a trench where the via's side walls are covered by the conformal layer while the trench's side walls are not covered by the conformal layer.

17 Claims, 9 Drawing Sheets

METHOD FOR FABRICATION AND STRUCTURE FOR HIGH ASPECT RATIO VIAS

BACKGROUND OF THE INVENTION

1. Field of the Invention

The present invention is generally in the field of fabrication of integrated circuit structures. In particular, the invention is in the field of fabrication of dual damascene via structures.

2. Background Art

It is known in the art that there is an ever-present demand for decreasing semiconductor device sizes and geometries. The demand is fueled by the requirement that each unit area of the semiconductor die supply greater computing power and functionality. The requirement to decrease semiconductor device sizes and geometries has resulted, among other things, in a need to reduce width of vias in interconnect structures. Another reason for the need to reduce width of vias is that due to the ever-decreasing space between neighboring interconnect metal lines, wide vias may cause shorts to neighboring interconnect metal lines which are laid out close to the interconnect metal line contacting the via.

Thus, it is generally appreciated in the art that narrow vias are desirable for reasons such as those mentioned above. Despite the desire to reduce the width of vias, there has been no pressing need to reduce the depth of vias to achieve performance improvements. There is no compelling requirement to reduce vertical space or dielectric thickness between two vertically adjacent interconnect metal layers. In fact, reducing dielectric thickness results in an increase in interconnect capacitance which degrades performance of the semiconductor chip. Moreover, as the number of interconnect metal layers increases, it is desirable to use thicker dielectric layers between the higher interconnect metal layers. The reason is that metal line widths for the higher interconnect layers are usually greater than metal line widths for the lower interconnect metal layers. Larger line widths result in larger inter-layer capacitance. As such, thicker dielectric layers are desired in order to decrease, or at least to prevent a potential increase in, the inter-layer capacitance between the higher interconnect metal layers. Thus, as the number of interconnect metal layers have increased, vias have had to be formed through thicker dielectrics existing between the higher interconnect metal layers. However, via widths connecting the higher interconnect metal layers to the lower interconnect metal layers should still be small in order to accommodate the smaller metal line widths of the lower interconnect metal layers.

Since it is desirable to reduce the width of vias while preserving or even increasing their depth, the "aspect ratio" (i.e. the ratio of via depth to via width) has been continually increasing. As aspect ratio of vias increase, it becomes more difficult to properly etch the via hole in the dielectric. The reason is that it becomes more difficult to perform the necessary anisotropic etch required to reach the desired bottom of the via without running into a number of problems. For example, it might be difficult to perform a plasma etch since the plasma might not reach the desired depth of the via. Also, even if the plasma reaches the desired depth, other parts of the semiconductor die undergoing fabrication may be undesirably removed due to the longer than typical exposure to plasma. For example, as the geometry of semiconductor and interconnect structures decreases, thinner photoresist must be used due to limitations in depth of focus in photolithography and the longer than typical exposure to plasma results in exhausting the photoresist. The challenge to etch deep and narrow via holes becomes even more difficult in fabrication of dual damascene interconnect structures. A typical method to fabricate vias in dual damascene interconnect structures requires deposition of both the via dielectric and the trench dielectric. The via hole must then be etched through both the via dielectric and the trench dielectric. As such, a deep hole through both the via dielectric and the trench dielectric must be etched.

U.S. Pat. No. 5,753,967 to Lin discusses fabrication of high aspect ratio vias. Lin discloses a technique for forming a trench and a via in a first dielectric and then reducing the width of the trench and the via by depositing a second dielectric into the trench and the via. According to Lin, the second dielectric would remain in the trench sidewall and it (i.e. the second dielectric remaining in the trench) may be silicon nitride or other dielectric. Dielectrics such as silicon nitride have a high dielectric constant which result in an unwanted increase in line to line capacitance between the interconnect metal lines formed in the trenches.

Moreover, according to Lin, the interconnect metal line width in the trench is reduced due to the second dielectric remaining in the trench. This results in an unwanted increase in the metal line resistance. Although it is possible to start with a wider trench to compensate for the reduction in the interconnect metal width which occurs upon deposition of the second dielectric, starting with wider trenches increases the metal pitch (i.e., the distance between the centers of two neighboring metal lines). This in turn results in a consumption of a larger area of the semiconductor die.

Thus, there is need in the art for fabricating high aspect ratio vias while resolving the shortcomings in the art as explained above.

SUMMARY OF THE INVENTION

The present invention discloses method for fabrication and structure for high aspect ratio vias. According to the invention's method, a via is first etched in a dielectric. Then a conformal layer is deposited over the dielectric and the via. The conformal layer reduces an initial width of the via to a target width. A trench is then etched in the dielectric and the conformal layer. Since the width of the via is reduced from the initial width to the target width, the resulting final via has a high aspect ratio, while the fabrication of the final high aspect ratio via has been made much easier as compared to the conventional fabrication methods. The via and the trench are then filled with metal which contacts an interconnect metal situated below the via. In one embodiment of the invention copper is used to fill the via and the trench and also as the interconnect metal below the via.

In one embodiment of the invention, the dielectric is silicon dioxide or fluorinated silicon dioxide and the conformal layer is silicon dioxide. In another embodiment of the invention, the dielectric is silicon dioxide or fluorinated silicon dioxide while the conformal layer is silicon nitride. In order to etch the trench in the dielectric and the conformal layer, a timed exposure to a carbon fluoride based plasma is employed. Alternatively, instead of timing the exposure to plasma, a suitable etch stop layer is used.

In the embodiment of the invention where silicon nitride is used as the conformal layer, the silicon nitride remaining on the dielectric is removed using either chemical mechanical polishing or a carbon fluoride based plasma.

The invention's final structure is a via and a trench where the via's side walls are covered by the conformal layer while the trench's side walls are not covered by the conformal layer.

DETAILED DESCRIPTION OF THE INVENTION

The present invention discloses method for fabrication and structure for high aspect ratio vias. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

In the present application, the invention is explained by reference to a "dual damascene" process. The term "damascene" is derived from the ancient in-laid metal artistry originated in Damascus. According to the "single damascene" process, trenches are cut into the dielectric and then filled with metal. Then excess metal over the wafer surface is removed to form desired interconnect metal patterns within the trenches. In contrast to the single damascene process, in the "dual damascene" process in addition to trenches cut in the dielectric, vias are also cut in the dielectric to connect the interconnect metal in the trench to the underlying metal layer. Although the present application discloses fabrication of high aspect ratio vias in a dual damascene process, the invention is also applicable to fabrication of high aspect ratio vias in semiconductor processes other than the dual damascene process.

Figure 1:
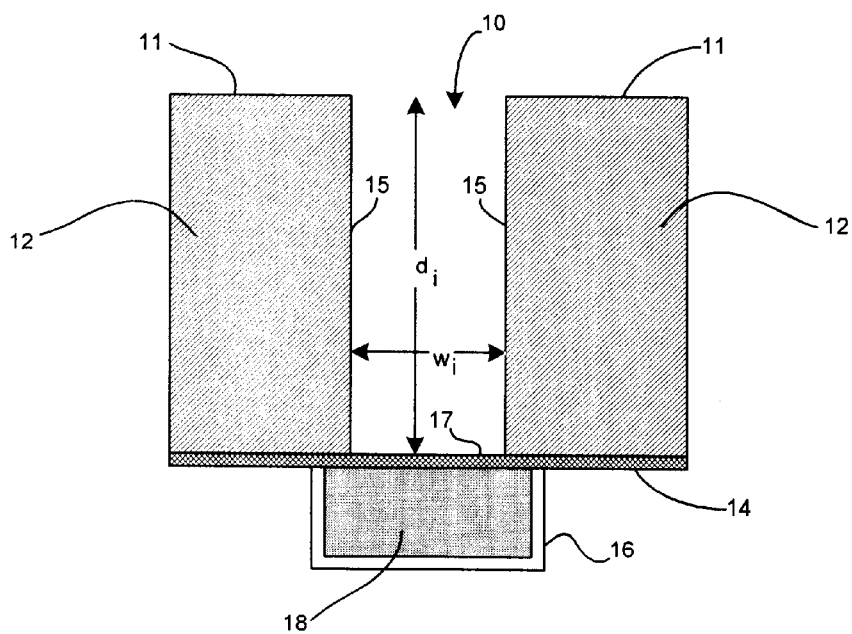
FIG. 1 illustrates a via with initial width $w_i$ etched in a dielectric.

One embodiment of the invention's method and structure to fabricate high aspect ratio vias is shown in FIGS. 1 through 7 which illustrate various process steps in the present invention by showing the cross sections of the resulting structures after each process step. As the invention's first step in the fabrication of a high aspect ratio via, FIG. 1 shows via 10 which has been etched in dielectric 12. In the present embodiment, dielectric 12 can be silicon dioxide or a low dielectric constant material such as fluorinated silicon dioxide (also called "FSG"). Via 10 has an initial depth "$d_i$" which is equal to the distance between top surface 11 of dielectric 12 and bottom 17 of via 10. Via 10 also has an initial width "$w_i$" which is equal to the distance between the two side walls 15 of via 10.

The initial aspect ratio of via 10 is thus $d_i/w_i$ ($d_i$ divided by $w_i$). By way of example, initial width $w_i$ can be 0.35 microns and initial depth $d_i$ can be 1.3 microns. In this example, the initial aspect ratio of via 10 is 3.71 (i.e. $d_i/w_i=1.3/0.35=3.71$). Barrier layer 14 runs under dielectric 12 and bottom 17 of via 10. In this embodiment of the invention, barrier layer 14 can be silicon nitride. Barrier layer 14 is used to prevent diffusion of underlying interconnect metal 18 into dielectric 12. In the present embodiment, interconnect metal 18 can be copper. As shown in FIG. 1, barrier layer 16 surrounds interconnect metal 18. In the present embodiment, barrier layer 16 can be tantalum, tantalum nitride, titanium nitride, or tungsten nitride. Barrier layers 14 and 16 encapsulate interconnect metal 18 and prevent it from diffusing out.

Figure 2:
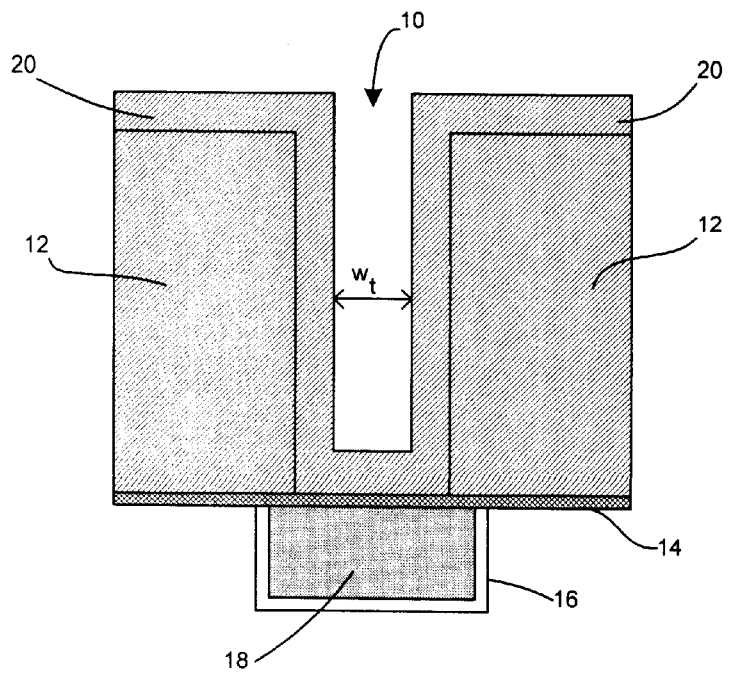
FIG. 2 illustrates a conformal layer deposited over the dielectric and via of FIG. 1.

FIG. 2 shows the result of the next step in the invention's process for fabricating a high aspect ratio via. As shown in FIG. 2, a conformal layer 20 blankets top surface 11 of dielectric 12 as well as side walls 15 and bottom 17 of via 10 (top surface 11, side walls 15 and bottom 17 are marked only in FIG. 1 and not in FIG. 2). In this embodiment, conformal layer 20 can be silicon dioxide or a low dielectric constant material such as fluorinated silicon dioxide. Conformal layer 20 is deposited over dielectric 12 and via 10 by deposition methods, such as chemical vapor deposition ("CVD"), known in the art. It is preferable that conformal layer 20 have a "step coverage" of nearly 100%. In other words, it is preferable that the thickness of conformal layer 20 remain constant over all parts of the conformal layer and, in particular, over those parts of conformal layer 20 which cover the steps formed at the meeting points of top surface 11 of dielectric 12 and side walls 15 of via 10.

As seen in FIG. 2, after depositing conformal layer 20, the width of via 10 is reduced to target width $w_t$. Target width $w_t$ is thus equal to initial width $w_i$ minus two times the thickness of conformal layer 20 along side wall 15. By way of example, if initial width $w_i$ is equal to 0.35 microns and the thickness of conformal layer 20 along side wall 15 is equal to 0.10 microns, target width $w_t$ would be equal to 0.15 microns.

Figure 3:
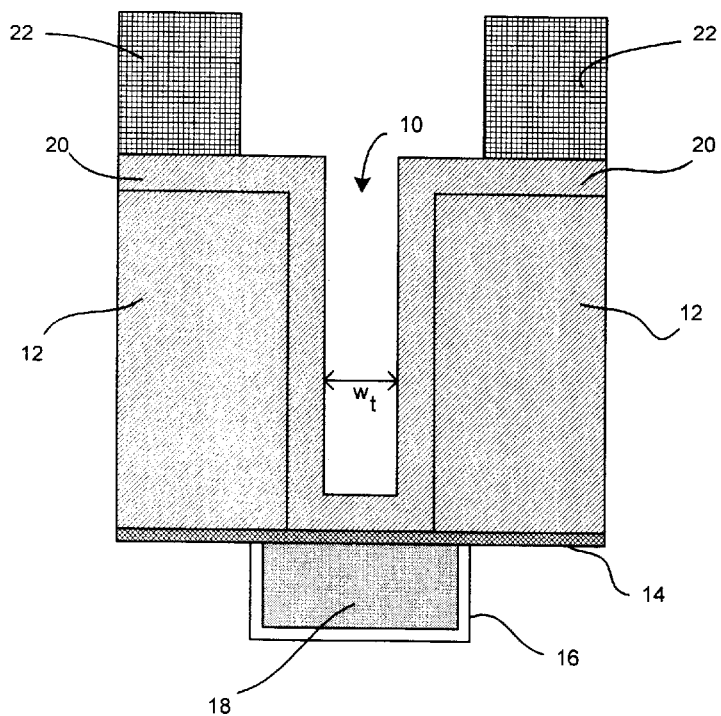
FIG. 3 illustrates photoresist with a trench pattern over the conformal layer of FIG. 2.
Figure 4:
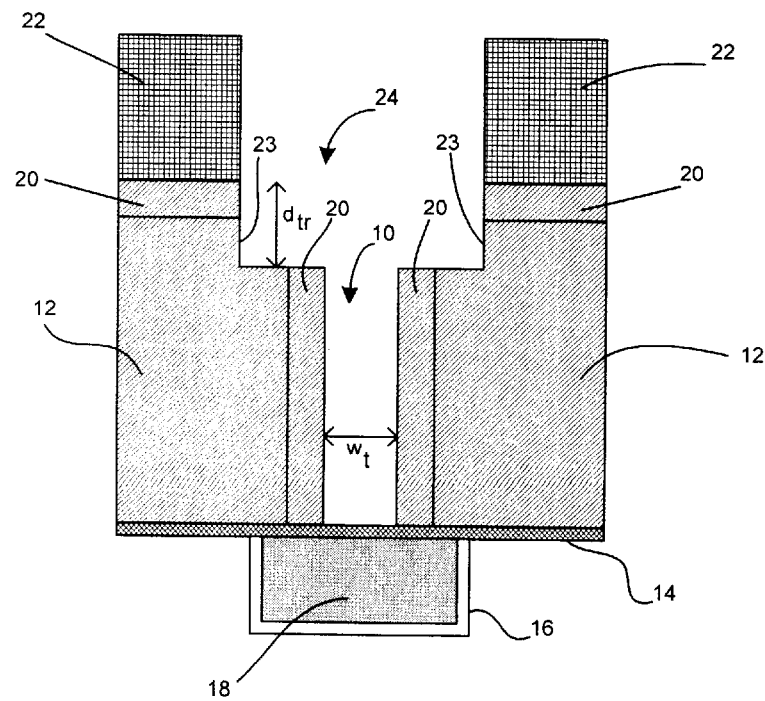
FIG. 4 illustrates a trench etched in the conformal layer and dielectric of FIG. 3 while photoresist pattern remains over the conformal layer.

The next step in the invention's process is shown in FIG. 3. FIG. 3 shows photoresist 22 patterned on top of conformal layer 20. Photoresist 22 is used to etch a trench in conformal layer 20 and dielectric 12. FIG. 4 shows trench 24 which is etched into conformal layer 20 and dielectric 12. Trench 24 is etched in dielectric 12 and conformal layer 20 using a conventional carbon fluoride based plasma with ratios of carbon and fluoride appropriately selected for etching silicon dioxide or fluorinated silicon dioxide as the case may be. The two side walls of trench 24 are pointed to by numeral 23.

In the present embodiment of the invention, trench depth $d_{tr}$ of trench 24 is determined by the length of time during which conformal layer 20 and dielectric 12 are exposed to the etching plasma. In another implementation of this embodiment of the invention, instead of timing the exposure to plasma, a suitable etch stop layer, such as silicon nitride, silicon carbide, aluminum oxide, or silicon oxynitride is used to achieve trench depth $d_{tr}$ of trench 24.

Figure 5:
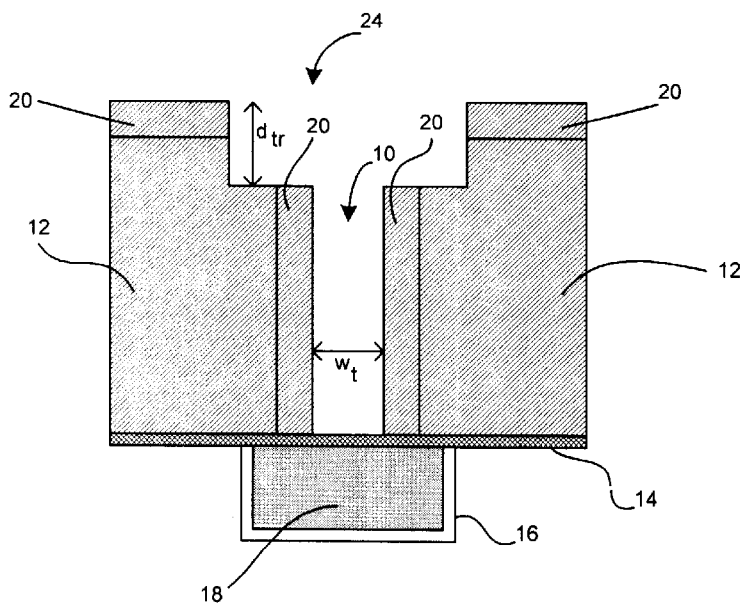
FIG. 5 illustrates the trench etched in the conformal layer and dielectric of FIG. 4, but photoresist pattern has been stripped.
Figure 6:
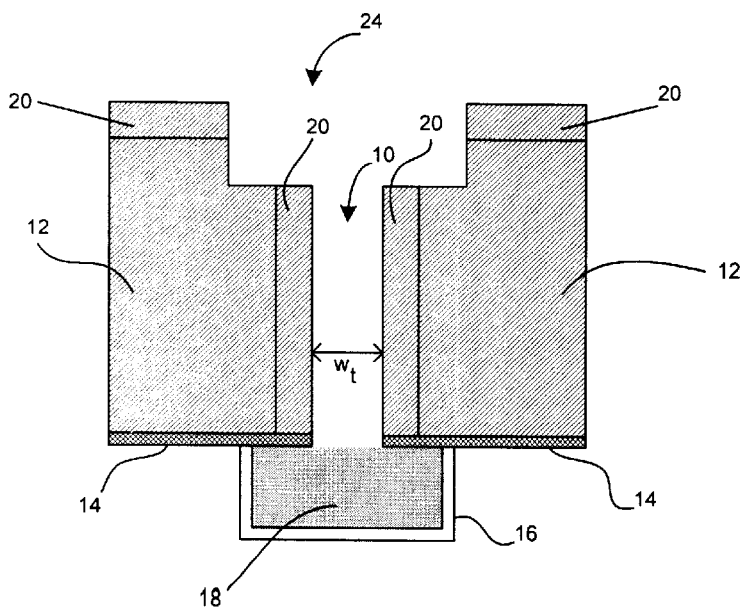
FIG. 6 illustrates the trench and via configuration of FIG. 5 after etching a barrier layer at bottom of the via.

The next step in the invention's process is to strip photoresist 22 which was used solely to protect the underlying conformal layer 20 and dielectric 12 during the etching of trench 24. Photoresist 22 is stripped using a conventional oxygen plasma or by using hydrogen plasma or forming gas ($H_2/N_2$). During this step barrier layer 14 protects interconnect metal 18 from being oxidized when interconnect metal 18 is copper and oxygen plasma is used. The result of this step is shown in FIG. 5. The next step in the invention's process is to remove barrier layer 14 from the bottom of via 10 by using a conventional carbon fluoride based plasma with ratios of carbon and fluoride appropriately selected for etching silicon nitride. The result of this step is shown in FIG. 6. As seen in FIG. 6, interconnect metal 18 is now exposed and can contact the metal used to fill via 10.

Figure 7:
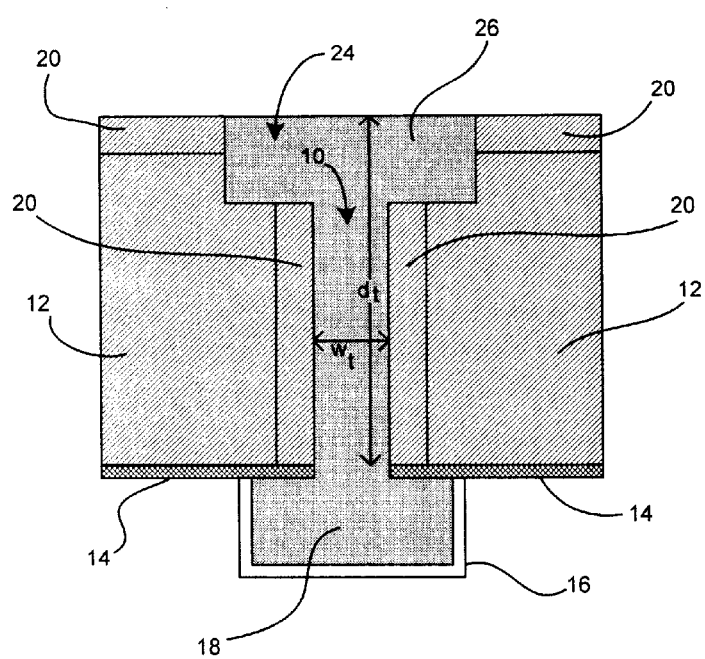
FIG. 7 shows the final structure of the invention's high aspect ratio via according to the embodiment of the invention illustrated in FIGS. 1 through 7.

The next and last step in the present embodiment of the invention is shown in FIG. 7. In this step, trench 24 and via 10 are filled with metal 26. In this embodiment of the invention, metal 26 can be copper. A typical method to fill trench 24 and via 10 with copper is to first deposit a barrier layer. This barrier layer is not shown in FIG. 7 or in any of the Figures. After deposition of the barrier layer either of two alternatives can be used. A first alternative is to perform a copper seed deposition followed by copper electroplating. A second alternative is to deposit copper by chemical vapor deposition ("CVD"). Following either of these two alternatives, chemical mechanical polishing ("CMP") is performed to remove excess copper over the wafer surface.

As shown in FIG. 7, metal 26 fills trench 24 and via 10 and contacts interconnect metal 18 which is situated below via 10. It is noted that the metal filling trench 24 is in fact part of an interconnect metal pattern situated on top of via 10. Thus, via 10 connects interconnect metal 18 situated below via 10 to an interconnect metal pattern above via 10.

It is noted that according to the conventional methods, a hole having a target depth $d_t$ ($d_t$ is shown in FIG. 7) and a target width $w_t$ ($w_t$ is also shown in FIG. 7) had to be etched to arrive at the final trench and via configuration shown in FIG. 7. It is further noted that $d_t$ is equal to 1.4 microns in the example used in the present application. The reason is that $d_t$ is equal to $d_i$ ($d_i$ is shown in FIG. 1 and is 1.3 microns) plus the thickness of conformal layer 20 (i.e. 0.1 microns). Moreover, as explained above, $w_t$ is equal to 0.15 microns. Thus, the aspect ratio of the required prior art hole (i.e. $d_t/w_t$) would be 9.33 (i.e. $d_t/w_t=1.4/0.15=9.33$). However, as explained above, the invention's requires a hole having an aspect ratio of merely 3.71 (i.e. $d_i/w_t=1.3/0.35=3.71$). Accordingly, the invention's method makes it much easier to arrive at the final desired trench and via structure shown in FIG. 7.

Figure 8:
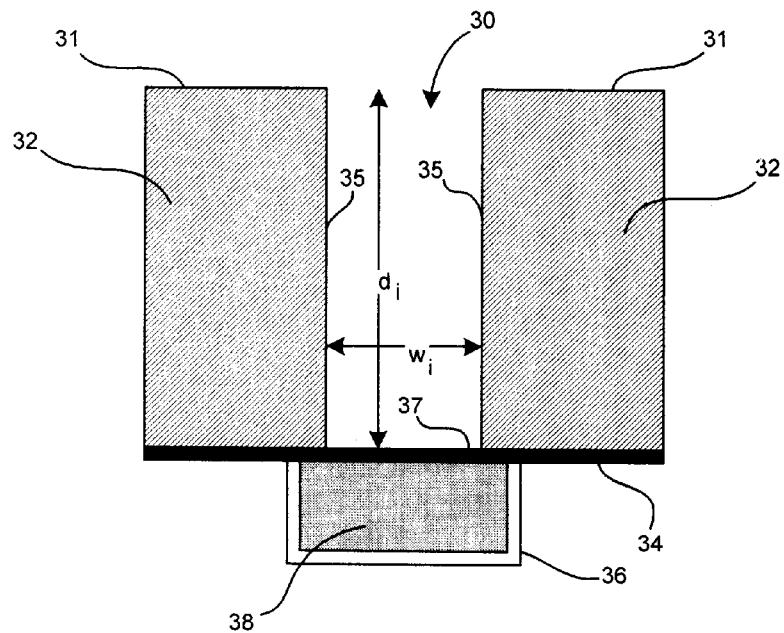
FIG. 8 illustrates a via with initial width $w_i$ etched in a dielectric.

Another embodiment of the invention's method and structure to fabricate high aspect ratio vias is shown in FIGS. 8 through 17 which illustrate various process steps in the present invention by showing the cross sections of the resulting structures after each process step. As the invention's first step in the fabrication of a high aspect ratio via in the present embodiment, FIG. 8 shows via 30 which has been etched in dielectric 32. In the present embodiment, dielectric 32 can be silicon dioxide or fluorinated silicon dioxide (also called "FSG"). Via 30 has an initial depth "$d_i$" which is equal to the distance between top surface 31 of dielectric 32 and bottom 37 of via 30. Via 30 also has an initial width "$w_i$" which is equal to the distance between the two side walls 35 of via 30.

The initial aspect ratio of via 30 is thus $d_i/w_i$ ($d_i$ divided by $w_i$). By way of example, initial width $w_i$ can be 0.35 microns and initial depth $d_i$ can be 1.3 microns. In this example, the initial aspect ratio of via 30 is 3.71 (i.e. $d_i/w_i=1.3/0.35=3.71$). Barrier layer 34 runs under dielectric 32 and bottom 37 of via 30. In this embodiment of the invention, barrier layer 34 can be silicon carbide or silicon nitride. However, silicon carbide is preferred since it has a lower dielectric constant than silicon nitride. Barrier layer 34 is used to prevent diffusion of underlying interconnect metal 38 into dielectric 32. In the present embodiment, interconnect metal 38 can be copper. As shown in FIG. 8, barrier layer 36 surrounds interconnect metal 38. In the present embodiment, barrier layer 36 can be tantalum, tantalum nitride, titanium nitride, or tungsten nitride. Barrier layers 34 and 36 encapsulate interconnect metal 38 and prevent it from diffusing out.

Figure 9:
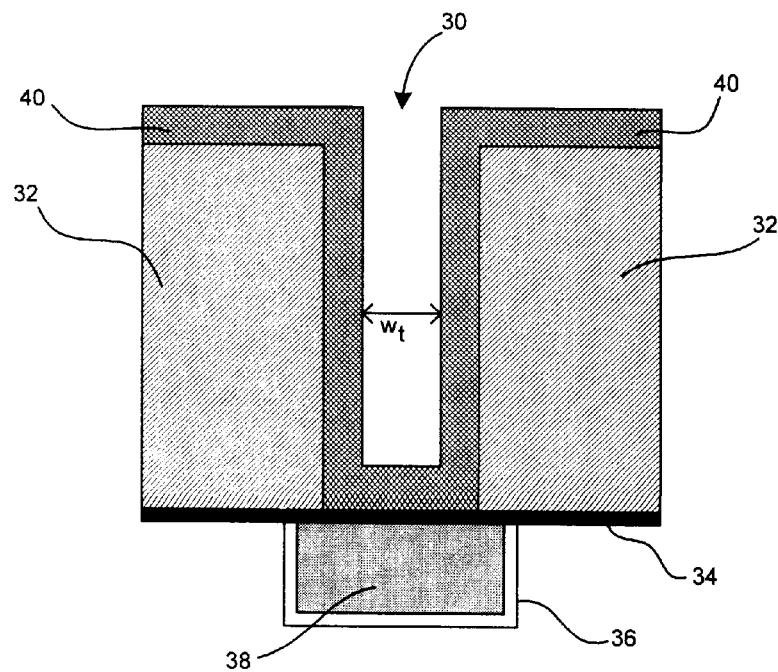
FIG. 9 illustrates a conformal layer deposited over the dielectric and via of FIG. 8.

FIG. 9 shows the result of the next step in the present embodiment of the invention's process for fabricating a high aspect ratio via. As shown in FIG. 9, a conformal layer 40 blankets top surface 31 of dielectric 32 as well as side walls 35 and bottom 37 of via 30 (top surface 31, side walls 35 and bottom 37 are marked only in FIG. 8 and not in FIG. 9). In this embodiment, conformal layer 40 can be silicon nitride. Conformal layer 40 is deposited over dielectric 32 and via 30 by deposition methods, such as chemical vapor deposition ("CVD"), known in the art. It is preferable that conformal layer 40 have a "step coverage" of nearly 100%. In other words, it is preferable that the thickness of conformal layer 40 remain constant over all parts of the conformal layer and, in particular, over those parts of conformal layer 40 which cover the steps formed at the meeting points of top surface 31 of dielectric 32 and side walls 35 of via 30.

As seen in FIG. 9, after depositing conformal layer 40, the width of via 30 is reduced to target width $w_t$. Target width $w_t$ is thus equal to initial width $w_i$ minus two times the thickness of conformal layer 40. By way of example, if initial width $w_i$ is equal to 0.35 microns and the thickness of conformal layer 40 is equal to 0.10 microns, target width $w_t$ would be equal to 0.15 microns.

Figure 10:
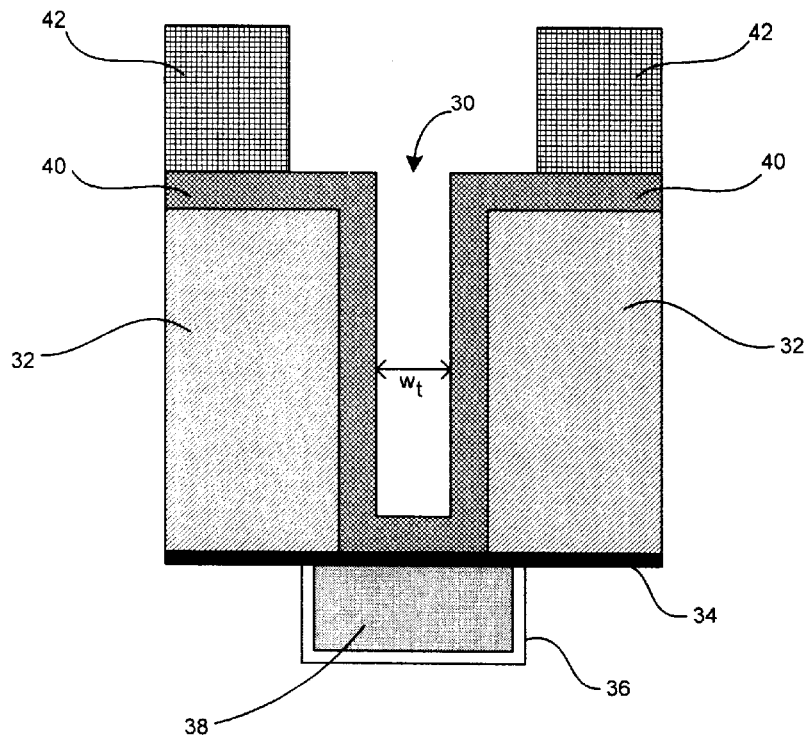
FIG. 10 illustrates photoresist with a trench pattern over the conformal layer of FIG. 9.
Figure 11:
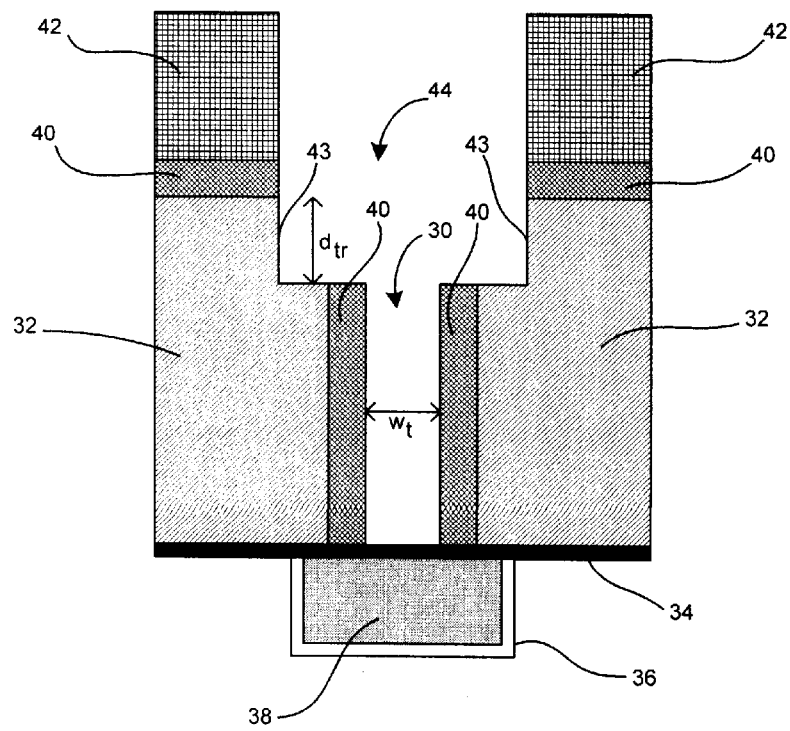
FIG. 11 illustrates a trench etched in the conformal layer and dielectric of FIG. 10 while photoresist pattern remains over the conformal layer.

The next step in the invention's process is shown in FIG. 10. FIG. 10 shows photoresist 42 patterned on top of conformal layer 40. Photoresist 42 is used to etch a trench in conformal layer 40 and dielectric 32. FIG. 11 shows trench 44 which is etched into conformal layer 40 and dielectric 32. Trench 44 is etched in dielectric 32 and conformal layer 40 using a conventional carbon fluoride based plasma with ratios of carbon and fluoride appropriately selected for etching silicon nitride conformal layer 40 and silicon dioxide or FSG dielectric 32. The two side walls of trench 44 are pointed to by numerals 43.

In the present embodiment of the invention, trench depth $d_{tr}$ of trench 44 is determined by the length of time during which conformal layer 40 and dielectric 32 are exposed to the etching plasma. In another implementation of this embodiment of the invention, instead of timing the exposure to plasma, a suitable etch stop layer such as silicon carbide, silicon nitride, aluminum oxide, or silicon oxynitride is used to achieve trench depth $d_{tr}$ of trench 44.

Figure 12:
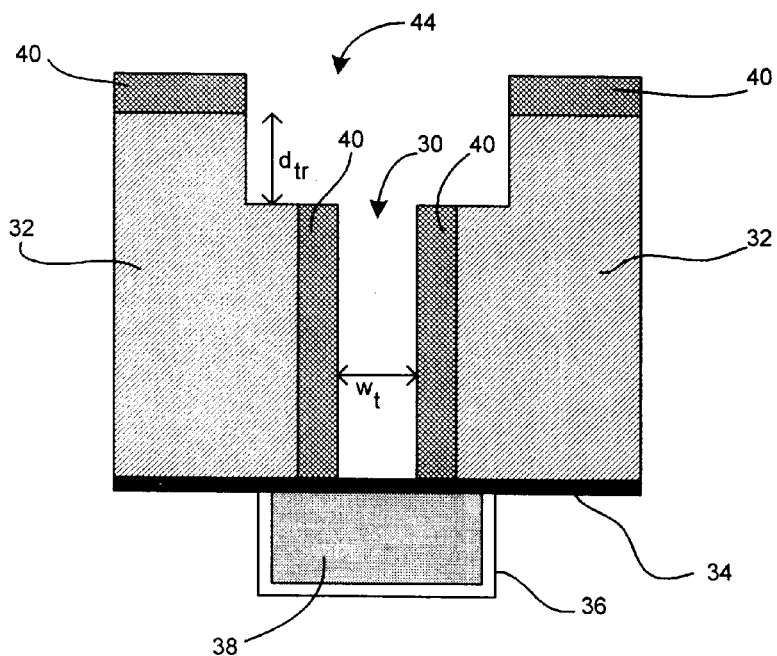
FIG. 12 illustrates the trench etched in the conformal layer and dielectric of FIG. 11, but photoresist pattern has been stripped.
Figure 13:
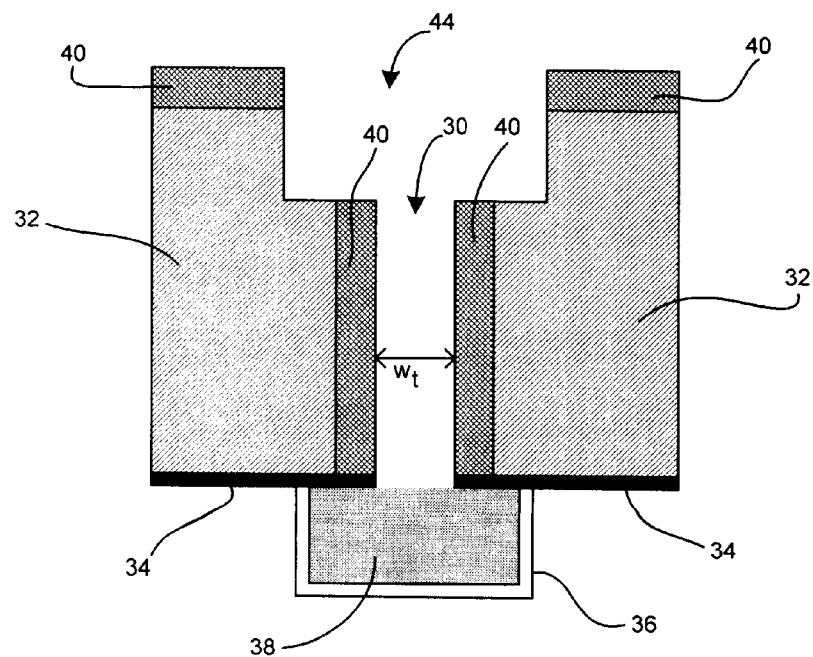
FIG. 13 illustrates the trench and via configuration of FIG. 12 after etching a barrier layer at bottom of the via.

The next step in the invention's process is to strip photoresist 42 which was used solely to protect the underlying conformal layer 40 and dielectric 32 during the etching of trench 44. Photoresist 42 is stripped by using a conventional oxygen plasma or by using hydrogen plasma or forming gas ($H_2/N_2$). The result of this step is shown in FIG. 12. It is noted that during this step, barrier layer 34 protects the copper interconnect metal 38 from being oxidized if oxygen plasma is used. The next step in the invention's process is to remove barrier layer 34 from the bottom of via 30 by using an appropriate etching plasma which is selective to conformal layer 40 and dielectric 32. The result of this step is shown in FIG. 13. As seen in FIG. 13, interconnect metal 38 is now exposed and can contact the metal used to fill via 30.

In a first implementation of the present embodiment of the invention, a metal such as copper is used to fill trench 44 and via 30. A typical method to fill trench 44 and via 30 with copper is to first deposit a barrier layer. This barrier layer is not shown in FIG. 14 or in any of the Figures. After deposition of the barrier layer either of two alternatives can be used. A first alternative is to perform a copper seed deposition followed by copper electroplating. A second alternative is to deposit copper by chemical vapor deposition ("CVD") or by physical vapor deposition ("PVD").

Figure 14:
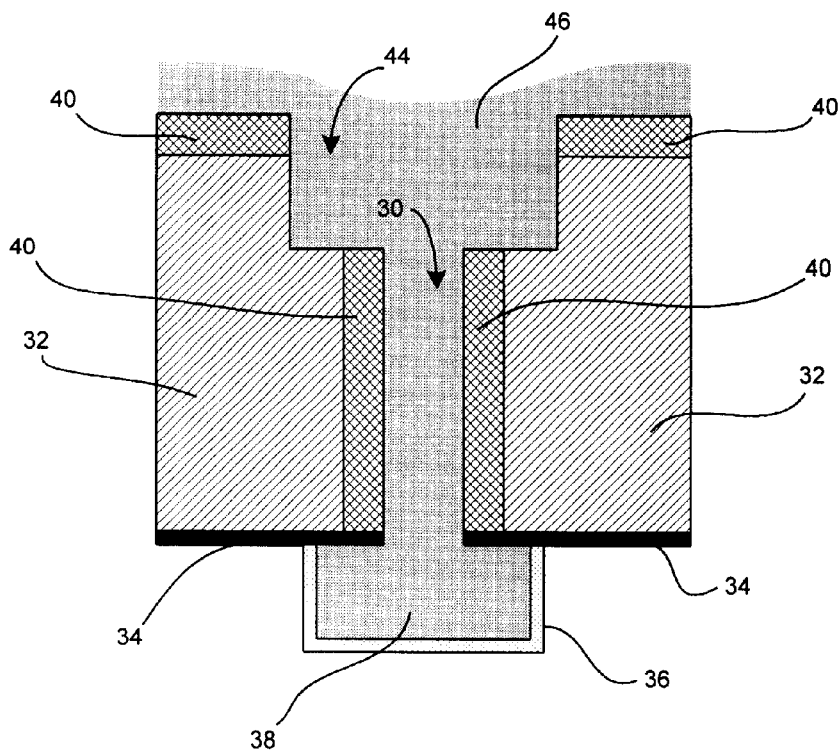
FIG. 14 shows the trench and the via of FIG. 13 when metal has filled the trench and the via.

The interim result of this step is shown in FIG. 14. FIG. 14 shows metal 46 inside trench 44 and via 30. As shown in FIG. 14, metal 46 contacts interconnect metal 38 situated below via 30. In this embodiment of the invention it is desirable to remove those portions of silicon nitride conformal layer 40 that remain on the top surface of dielectric 32. The reason is that silicon nitride has a high dielectric constant and causes a relatively large increase in line to line capacitance between the interconnect metal in trench 44 and the neighboring interconnect metal (the neighboring interconnect metal is not shown in any of the Figures).

In this implementation of the present embodiment, in order to remove those portions of silicon nitride conformal layer 40 that have remained on the top surface of dielectric 32, a conventional chemical mechanical polish ("CMP") can be used. CMP is used first to remove the excess metal 46 over the wafer surface and then to remove silicon nitride conformal layer 40 from the top surface of dielectric 32. The final structure of the invention's high aspect ratio via is shown in FIG. 15.

Figure 15:
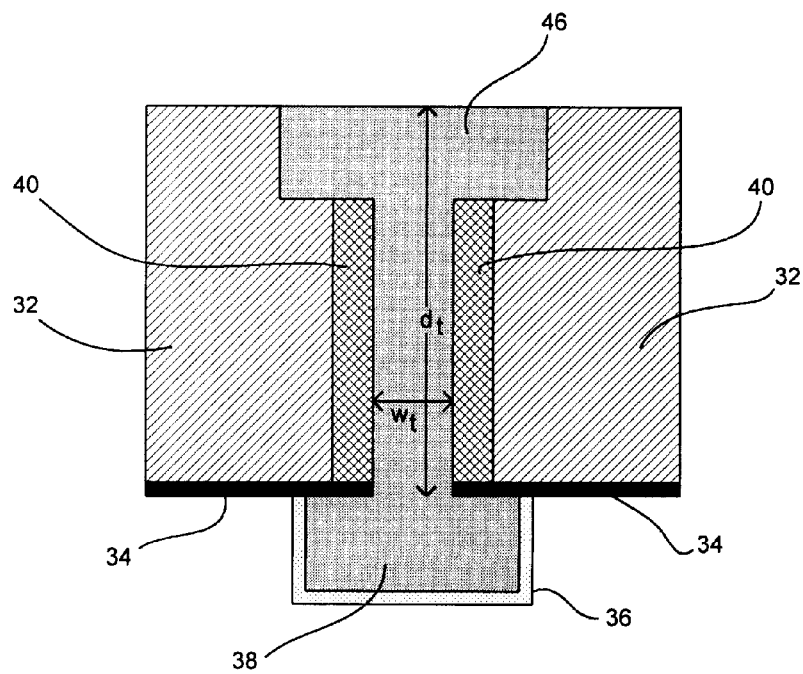
FIG. 15 shows the final structure of the invention's high aspect ratio via according to the embodiment of the invention illustrated in FIGS. 8 through 15.

It is noted that according to the conventional methods, a hole having a target depth $d_t$ ($d_t$ is shown in FIG. 15) and a target width $w_t$ ($w_t$ is also shown in FIG. 15) had to be etched to arrive at the final trench and via configuration shown in FIG. 15. It is further noted that $d_t$ is equal to 1.3 microns in the example used in the present application. The reason is that $d_t$ is equal to $d_i$ ($d_i$ is shown in FIG. 8 and is 1.3 microns in this example) since conformal layer 40 is completely removed. Moreover, as explained above, $w_t$ is equal to 0.15 microns. Thus, the aspect ratio of the required prior art hole (i.e. $d_t/w_t$) would be 8.66 (i.e. $d_t/w_t=1.3/0.15=8.66$). However, as explained above, the invention's requires a hole having an aspect ratio of merely 3.71 (i.e. $d_i/w_i=1.3/0.35=3.71$). Accordingly, the invention's method makes it much easier to arrive at the final desired trench and via structure shown in FIG. 15.

Figure 16:
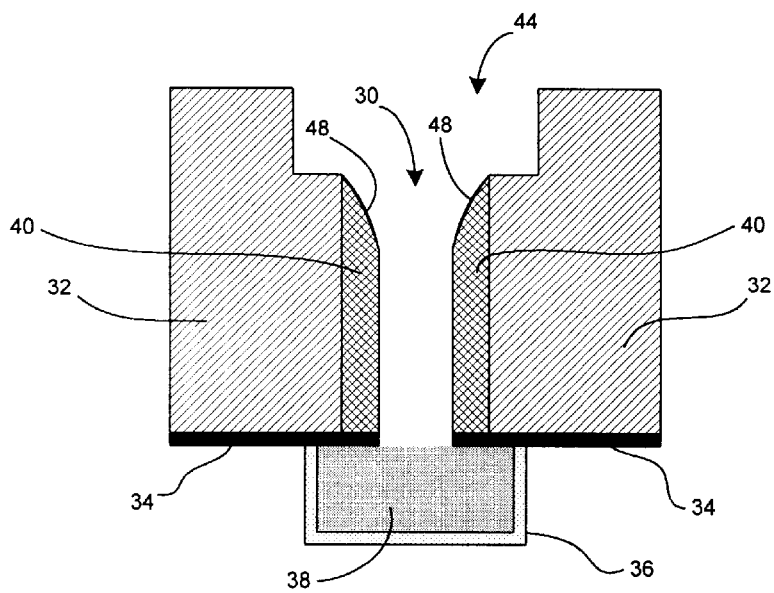
FIG. 16 shows the trench and the via of FIG. 12 when the conformal layer on the dielectric surface and the barrier layer at bottom of the via have been removed.

In a second implementation of the present embodiment of the invention, after stripping the trench photoresist and before removing barrier layer 34 from bottom of via 30 (see FIG. 12), the portions of silicon nitride conformal layer 40 that have remained on the top surface of dielectric 32 are first removed. The removal can be done by a conventional carbon fluoride based plasma with ratios of carbon and fluoride appropriately selected for etching silicon nitride. Barrier layer 34 at bottom of via 30 can be removed during this step, particularly when barrier layer 34 is silicon nitride. The result of this step is shown in FIG. 16. As seen in FIG. 16, a side effect of the etching of the silicon nitride conformal layer 40 from the top surface of dielectric 32, is that some of the silicon nitride conformal layer that was deposited over side walls 35 of via 30 may also be etched away. This inadvertent etching of the conformal layer causes a rounding off effect at the edges of the conformal layer pointed to by numeral 48 in FIG. 16, although other shapes might result depending on the etch chemistry used.

The next step of this implementation of the present embodiment is to fill trench 44 and via 30 with a metal such as copper. As discussed above, a typical method to fill trench 44 and via 30 with copper is to first deposit a barrier layer. This barrier layer is not shown in FIG. 17 or in any of the Figures. After deposition of the barrier layer either of two alternatives can be used. A first alternative is to perform a copper seed deposition followed by copper electroplating. A second alternative is to deposit copper by chemical vapor deposition ("CVD") or by physical vapor deposition ("PVD").

Figure 17:
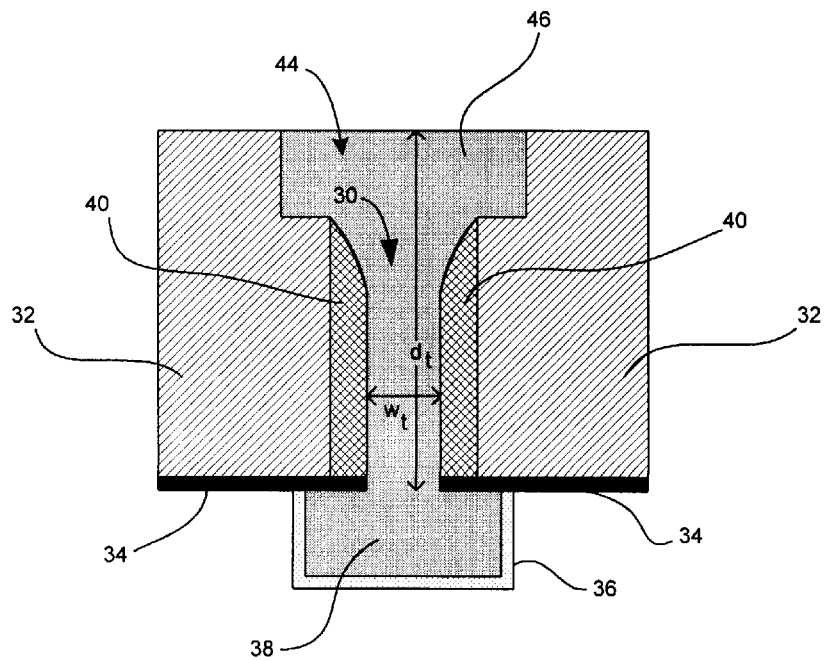
FIG. 17 shows the final structure of the invention's high aspect ratio via according to the embodiment of the invention illustrated in FIGS. 8 through 12 and 16 through 17.

The result of this step is shown in FIG. 17. FIG. 17 shows metal 46 inside trench 44 and via 30. As shown in FIG. 17, metal 46 contacts interconnect metal 38 situated below via 30. FIG. 17 thus shows the final structure of the invention's high aspect ratio via according to the second implementation of the present embodiment. It is noted that according to the conventional methods, a hole having a target depth $d_t$ ($d_t$ is shown in FIG. 17) and a target width $w_t$ ($w_t$ is also shown in FIG. 17) had to be etched to arrive at the final trench and via configuration shown in FIG. 17. It is further noted that $d_t$ is equal to 1.3 microns in the example used in the present application. The reason is that $d_t$ is equal to $d_i$ ($d_i$ is shown in FIG. 8 and is 1.3 microns in this example) since conformal layer 40 is completely removed. Moreover, as explained above, $w_t$ is equal to 0.15 microns. Thus, the aspect ratio of the required prior art hole (i.e. $d_t/w_t$) would be 8.66 (i.e. $d_t/w_t=1.3/0.15=8.66$). However, as explained above, the invention's requires a hole having an aspect ratio of merely 3.71 (i.e. $d_i/w_i=1.3/0.35=3.71$). Accordingly, the invention's method makes it much easier to arrive at the final desired trench and via structure shown in FIG. 17. It is further noted that in both the first and second implementations of this embodiment of the invention, the metal filling trench 44 is in fact part of an interconnect metal pattern situated on top of via 30. Thus, via 30 connects interconnect metal 38 situated below via 30 to an interconnect metal pattern above via 30.

As shown in FIGS. 7, 15, and 17, in the final structures of the invention, there is no conformal layer left on the side walls of the trenches. In comparison to the prior art, this results in the significant benefit of a low line-to-line capacitance since the typical conformal layer used possesses a high dielectric constant.

While certain embodiments are illustrated in the drawings and are described herein, it is apparent to those of ordinary skill in the art that the specific embodiments described herein may be modified without departing from the inventive concepts described. For example, various combinations of materials may be used as the dielectric (examples of which are low dielectric constant materials such as porous silica, fluorinated amorphous carbon, fluoro-polymer, parylene, polyarylene ether, silsesquioxane, fluorinated silicon dioxide, and diamondlike carbon), the conformal layer, and the barrier layer to meet certain design requirements. In addition, various combinations of etching, CMP, etch stop layers, and other techniques known in the art may be used to accomplish the invention's concepts described herein. Furthermore, although the drawings show examples of a trench wherein the trench is wider than the via, this is not a requirement.

Thus, method for fabrication and structure for high aspect ratio vias have been described.

What is claimed is:

1. A method for fabricating a via and trench structure, the method comprising the steps of:

etching a via in a first dielectric, said via having an initial width;

depositing a conformal dielectric layer over said first dielectric and said via so as to reduce said initial width to a target width;

etching a trench in said first dielectric and said conformal dielectric layer over said via, so as to remove said conformal dielectric layer from first and second trench side walls.

2. The method of claim 1 further comprising the step of filling said via with metal, said metal connecting a first interconnect metal below said via to a second interconnect metal in said trench.

3. The method of claim 2 wherein said metal, said first interconnect metal, and said second interconnect metal are copper.

4. The method of claim 1 wherein said first dielectric is selected from the group consisting of silicon dioxide and fluorinated silicon dioxide.

5. The method of claim 1 wherein said conformal dielectric layer is selected from the group consisting of silicon dioxide and silicon nitride.

6. The method of claim 1 wherein said step of etching said trench is performed by plasma.

7. The method of claim 1 wherein said step of etching said trench is performed by utilizing an etch stop layer.

8. A method for fabricating a via for connecting a first interconnect metal below said via to a second interconnect metal above said via, the method comprising the steps of:

etching a via in a first dielectric, said via having an initial width;

depositing a conformal dielectric layer over said first dielectric and said via so as to reduce said initial width to a target width;

etching a trench in said first dielectric and said conformal dielectric layer over said via, so as to remove said conformal dielectric layer from first and second trench side walls;

filling said via and trench with metal, said metal having a width in said via less than said initial width and substantially equal to said target width, said metal connecting said first interconnect metal below said via to said second interconnect metal above said via.

9. The method of claim 8 wherein said metal, said first interconnect metal, and said second interconnect metal are copper.

10. The method of claim 8 wherein said first dielectric is selected from the group consisting of silicon dioxide and fluorinated silicon dioxide.

11. The method of claim 8 wherein said conformal dielectric layer is selected from the group consisting of silicon dioxide and silicon nitride.

12. The method of claim 8 wherein said step of etching said trench is performed by plasma.

13. The method of claim 8 wherein said step of etching said trench is performed by utilizing an etch stop layer.

14. The method of claim 8 further comprising the step of removing said conformal dielectric layer from said first dielectric after said filling step.

15. The method of claim 14 wherein said step of removing is performed by chemical mechanical polishing.

16. The method of claim 8 further comprising the step of removing said conformal dielectric layer from said first dielectric after said step of etching said trench and before said filling step.

17. The method of claim 16 wherein said step of removing is performed by plasma.

* * * * *